United States Patent
Takatsuka et al.

(10) Patent No.: US 10,714,940 B2
(45) Date of Patent: Jul. 14, 2020

(54) POWER STORAGE CONTROL APPARATUS AND POWER STORAGE CONTROL METHOD

(71) Applicant: OMRON Corporation, Kyoto (JP)

(72) Inventors: Hiromasa Takatsuka, Nara (JP); Kazuki Kasai, Kizugawa (JP); Fumiji Aita, Nara (JP); Hiroshi Imai, Nara (JP)

(73) Assignee: OMRON Corporation, Kyoto (JP)

( * ) Notice: Subject to any disclaimer, the term of this patent is extended or adjusted under 35 U.S.C. 154(b) by 481 days.

(21) Appl. No.: 15/382,759

(22) Filed: Dec. 19, 2016

(65) Prior Publication Data
US 2017/0250537 A1 Aug. 31, 2017

(30) Foreign Application Priority Data
Feb. 25, 2016 (JP) ................................. 2016-034545

(51) Int. Cl.
*H02J 13/00* (2006.01)
*H02J 3/38* (2006.01)
(Continued)

(52) U.S. Cl.
CPC ............ *H02J 3/383* (2013.01); *H01L 31/042* (2013.01); *H02J 7/0068* (2013.01);
(Continued)

(58) Field of Classification Search
CPC ........ G01R 1/00; H02J 13/0013; H02J 3/383; H02J 7/0068; H02J 13/0006; H02J 3/32;
(Continued)

(56) References Cited

U.S. PATENT DOCUMENTS

2014/0365027 A1* 12/2014 Namba ............... H02J 3/32
  700/297
2015/0372518 A1* 12/2015 Toya .................. G06F 3/0488
  320/106
(Continued)

FOREIGN PATENT DOCUMENTS

JP 2008091085 4/2008
JP 2013-169137 8/2013
(Continued)

OTHER PUBLICATIONS

"Office Action of Japan Counterpart Application," with machine English translation thereof, dated Aug. 7, 2018, p. 1-p. 9.

*Primary Examiner* — Rexford N Barnie
*Assistant Examiner* — Toan T Vu
(74) *Attorney, Agent, or Firm* — JCIPRNET (57) ABSTRACT

Provided are a power storage control apparatus and a power storage control method with which a second power storage apparatus connected to a first storage apparatus via a power distribution network can be used based on an availability status of the first power storage apparatus under a configuration that a plurality of power storage apparatuses are deployed in the power distribution network. The power storage control apparatus includes a status determination part, a signal generation part and a communication part. The status control part determines the availability status of the first power storage apparatus deployed in the power distribution network. The signal generation part generates a control signal for using the second power storage apparatus connected to the first storage apparatus in the power distribution network instead of the first power storage apparatus based on a determination result from the status determination part. The communication part transmits the control
(Continued)

signal generated by the signal generation part to the second power storage apparatus.

11 Claims, 6 Drawing Sheets

(51) Int. Cl.
*H02J 7/00* (2006.01)
*H02S 10/00* (2014.01)
*H01L 31/042* (2014.01)
*H02J 7/35* (2006.01)
*H01M 10/48* (2006.01)
*H02J 3/32* (2006.01)

(52) U.S. Cl.
CPC .......... *H02J 13/0013* (2013.01); *H02S 10/00* (2013.01); *H01M 10/48* (2013.01); *H01M 2220/10* (2013.01); *H02J 3/32* (2013.01); *H02J 7/35* (2013.01); *H02J 13/0006* (2013.01); *Y02E 10/563* (2013.01); *Y02E 10/566* (2013.01); *Y02E 40/72* (2013.01); *Y02E 60/722* (2013.01); *Y02E 60/74* (2013.01); *Y04S 10/123* (2013.01); *Y04S 10/14* (2013.01); *Y04S 10/30* (2013.01)

(58) Field of Classification Search
CPC .. H02J 7/35; H02S 10/00; H02S 40/38; H02S 50/00; H01M 2220/10; Y02E 10/563; Y02E 10/566; Y02E 40/72; Y02E 60/722; Y02E 60/74; Y02P 90/50; Y04S 10/123; Y04S 10/14; Y04S 10/30
USPC .......................................................... 307/46
See application file for complete search history.

(56) References Cited

U.S. PATENT DOCUMENTS

2016/0211681 A1* 7/2016 Tsurumaru ................ H02J 3/32
2018/0241210 A1* 8/2018 Terai .......................... H02J 3/14

FOREIGN PATENT DOCUMENTS

| JP | 2015-126564 | 7/2015 |
| JP | 2015-177580 | 10/2015 |
| WO | 2013103011 | 7/2013 |
| WO | 2015040724 | 3/2015 |

\* cited by examiner

| Power storage apparatus ID | Impedance (mΩ) | Capacity (wh) | Capacity unused for past one month (wh) | Consent for use |
|---|---|---|---|---|
| 10000 | 0 | 1000 | - | - |
| 10001 | 0.7 | 1000 | 100 | ○ |
| 10002 | 1.1 | 2000 | 300 | × |
| 10003 | 2.0 | 1000 | 100 | ○ |
| 10004 | 0.8 | 800 | 100 | × |
| 10005 | 1.1 | 2000 | 500 | ○ |
| 10006 | 0.9 | 1000 | 200 | ○ |
| 10007 | 1.0 | 1000 | 100 | ○ |
| 10008 | 0.7 | 3000 | 500 | × |
| 10009 | 1.5 | 1000 | 200 | × |

POWER STORAGE CONTROL APPARATUS AND POWER STORAGE CONTROL METHOD

CROSS-REFERENCE TO RELATED APPLICATION

This application claims the priority benefit of Japan application serial no. 2016-034545, filed on Feb. 25, 2016. The entirety of the above-mentioned patent application is hereby incorporated by reference herein and made a part of this specification.

BACKGROUND OF THE INVENTION

Field of the Invention

The disclosure relates to a power storage control apparatus and a power storage control method that control a plurality of power storage apparatuses deployed in a power distribution network.

Description of Related Art

In recent years, power storage apparatuses that temporarily store electric power are deployed in a power distribution network in which a plurality of consumers are connected. Periodical maintenances are performed on such power storage apparatuses to maintain the performance thereof. Here, it has been known that the full power storage capacity of the power storage apparatus is decreased every time the charge/discharge control is performed. To accurately measure the full power storage capacity of the power storage apparatus at a given time, it is required to completely discharge the power storage apparatus by arranging a certain period of unused time and then charge the power storage apparatus with a minute current.

For example, Patent Document 1 discloses an electric power network system that shares a power storage apparatus connected to a smart-grid network so that a user who does not own a power storage apparatus can use the shared power storage apparatus via the network.

PRIOR ART LITERATURE

Patent Literature

Patent Document 1: Japanese Patent Laid-Open No. 2013-169137.
Patent Document 2: Japanese Patent Laid-Open No. 2015-177580.
Patent Document 3: Japanese Patent Laid-Open No. 2015-126564.

However, the abovementioned conventional electric power network system has the following issue. The systems disclosed in the above Patent Documents supply electricity from a power storage apparatus shared in the network to a user to whom the power procurement is allowed. However, the user is unable to receive the electricity supply from the shared power storage apparatus if the shared power storage apparatus is not available because of maintenance or a failure with such a system configuration.

SUMMARY OF THE DISCLOSURE

The disclosure provides a power storage control apparatus and a power storage control method that allow to use the second power storage apparatus that is connected to the first power storage apparatus in the power distribution network according to the availability status of the first power storage apparatus under the configuration in which a plurality of power storage apparatuses are deployed in the power distribution network.

A power storage control apparatus according to an embodiment of the disclosure is a power storage control apparatus that performs the charge/discharge control of a plurality of power storage apparatuses deployed in a power distribution network, and includes a status determination part, a signal generation part and a communication part. The state determination part determines the availability status of the first power storage apparatus deployed in the power distribution network. The signal generation part generates a control signal for using the second power storage apparatus connected to the first storage apparatus in the power distribution network instead of the first storage apparatus based on the determination result from the status determination part. The connection part transmits the control signal generated by the signal generation part to the second power storage apparatus.

Here, based on the determination result of the availability status of the first power storage apparatus which is included in the plurality of power storage apparatuses deployed in the power distribution network, the power storage control apparatus performs the control to use another power storage apparatus (the second power storage apparatus) deployed nearby in the power distribution network instead of the first power storage apparatus. That is, when the first power storage apparatus is determined to be in an unavailable state, the power storage control apparatus generates a control signal for using the second power storage apparatus deployed in the power distribution network nearby the first power storage apparatus instead of the first power storage apparatus, and transmits the control signal to the second power storage apparatus.

Here, the second power storage apparatus which is used instead of the first power storage apparatus based on the availability status of the first power storage apparatus may be a single power storage apparatus or a plurality of power storage apparatuses. That is, a plurality of the second storage apparatuses may be used instead of the first power storage apparatus. Also, the availability status of the first power storage apparatus determined by the status determination part is a status indicating whether it is available as a power storage apparatus or not, and includes the unavailable state due to maintenance, the unavailable state due to a failure, the normal operational state, etc., for example.

Also, the determination of the abovementioned states of the first power storage apparatus uses the detection result of various sensors that measure current, voltage, etc. of cells included in the first power storage apparatus or information of the maintenance schedule, etc. Moreover, the usage of the second power storage apparatus includes, for example, a charge control that stores surplus power from each consumer or a discharge control that covers power consumption at each consumer, etc.

Whether the second power storage apparatus is deployed nearby in the power distribution network or not can be determined by using information such as the impedance value between the first power storage apparatus and the second power storage apparatus and the electricity network structure. Thereby, regarding a plurality of power storage apparatuses deployed nearby in the power distribution network, if a specific power storage apparatus (the first power storage apparatus) is unavailable, another power storage apparatus (the second power storage apparatus) can be used.

In the power storage control apparatus according to an embodiment of the disclosure, the status determination part determines whether the first power storage apparatus is in the maintenance state or not. Here, whether the first power storage apparatus is under maintenance or not (availability) is determined and used as the status determination of the first power storage apparatus. Here, whether the first power storage apparatus is under maintenance or not is determined by, for example, using information of a pre-stored maintenance schedule, etc. or the input/output current value, the voltage value, etc. of the cells detected by using various sensors.

Thereby, if the first power storage apparatus is determined to be under maintenance, the second power storage apparatus deployed nearby in the power distribution network can be used since the first power storage apparatus is not available until the maintenance is completed.

In the power storage control apparatus according to an embodiment of the disclosure, the status determination part determines whether the first power storage apparatus is in an unavailable state or not. Here, whether the first power storage apparatus is unavailable or not (availability) is determined and used as the status determination of the first power storage apparatus. Here, whether the first power storage apparatus is available or not is determined by, for example, using the input/output current value, the voltage value, etc. of the cells detected by using various sensors. Thereby, if the first power storage apparatus is determined to be unavailable, the second power storage apparatus deployed nearby in the power distribution network can be used since the first power storage apparatus is not available.

In the power storage control apparatus according to an embodiment of the disclosure, the status determination part determines whether the first power storage apparatus is unavailable or not based on the detection result of at least one of an accelerator sensor, a temperature sensor, a current sensor and a voltage sensor attached to the first power storage apparatus. Here, whether the first power storage apparatus is unavailable or not is determined by using the detection result of at least one of the accelerator sensor, the temperature sensor, the current sensor and the voltage sensor attached to the first power storage apparatus and used as the status determination of the first power storage apparatus.

Here, the first power storage apparatus may be experiencing a failure if a detection result indicates a large impact from the accelerator sensor, a temperature abnormality from the temperature sensor, or an abnormal deterioration of the remaining capacity is detected by the current sensor, the voltage sensor or the temperature sensor, for example. Thereby, it is possible to determine whether the first power storage apparatus is unavailable or not by using the detection result from at least one of the accelerator sensor, the temperature sensor, the current sensor and the voltage sensor.

In the power storage control apparatus according to an embodiment of the disclosure, the status determination part determines whether the first power storage apparatus is in the failure state or not based on a detection result from the voltage sensor attached to the first power storage apparatus. Here, whether the first power storage apparatus is in the failure state or not is determined by using the detection result from the voltage sensor attached to the first power storage apparatus and used as the status determination of the first power storage apparatus. Thereby, it is possible to determine whether the first power storage apparatus is in the failure state or not by using the detection result from the voltage sensor.

In the power storage control apparatus according to an embodiment of the disclosure, the status determination part determines whether the first power storage apparatus is in a normal operational state or not. Here, whether the first power storage apparatus is operating normally or not (availability) is determined and used as the status determination of the first power storage apparatus.

Here, whether the first power storage apparatus is in the normal operational state or not is determined by using the input/output current value, the voltage value, etc. of the cells detected by various sensors. Thereby, if the first power storage apparatus is determined to be in the normal operational state, it is not necessary to generate the control signal for using the second power storage apparatus since the first power storage apparatus is available.

The power storage control apparatus according to an embodiment of the disclosure further includes a search part that searches the second power storage apparatus deployed in the power distribution network. Here, as mentioned above, if the first power storage apparatus is determined to be unavailable from the result of the availability determination of the first power storage apparatus, another power storage apparatus (the second power storage apparatus) deployed in the power distribution network nearby the first power storage apparatus will be searched. Here, the search criteria for the second power storage apparatus includes, for example, the impedance value between the first power storage apparatus and a candidate or the impedance value between a power consumption unit of the consumer who owns the first power storage apparatus and a candidate, an unused battery capacity, etc. Thereby, it is possible to find a desired second power storage apparatus deployed nearby in the power distribution network and use it instead of the first power storage apparatus even the first power storage apparatus is unavailable.

In the power storage control apparatus according to an embodiment of the disclosure, the signal generation part generates a control signal for controlling charge/discharge of a plurality of the second power storage apparatuses.

Here, as mentioned above, if the first power storage apparatus is determined to be unavailable from the result of the availability determination of the first power storage apparatus, a plurality of the second power storage apparatuses deployed in the power distribution network nearby the first power storage apparatus will be used instead of the first power storage apparatus. Here, as a case where a plurality of the second power storage apparatuses are used, for example, the capacity of the first power storage apparatus is greater than the capacity of another second power storage apparatus deployed nearby in the power distribution network, so the capacity of a single second power storage apparatus is insufficient. Also, it would be considered as the case where the usable capacity of a candidate for the second power storage apparatus is low, so the capacity of a single second power storage apparatus is insufficient. Thereby, a plurality of the second power storage apparatuses deployed nearby in the power distribution network can be used instead of the first power storage apparatus.

In the power storage control apparatus according to an embodiment of the disclosure, the signal generation part generates a control signal for using at least a portion of the power storage capacity of the second power storage apparatus.

Here, as mentioned above, if the first power storage apparatus is determined to be unavailable from the result of the availability determination of the first power storage apparatus, a reservation signal for reserving the use of at least a portion of the power storage capacity of the second power storage apparatus is generated. Therefore, by reserving and using the unused portion of the power storage capacity, the second power storage apparatus can be used without imposing inconvenience to the owner, etc. of the second power storage apparatus even the owner, etc. of the second power storage apparatus is already using the second power storage apparatus.

In the power storage control apparatus according to an embodiment of the disclosure, the signal generation part controls the input/output current of the second power storage apparatus by a control signal. Here, as mentioned above, if the first power storage apparatus is determined to be unavailable from the result of the availability determination of the first power storage apparatus, the input current and the output current of the second power storage apparatus deployed in a power distribution network nearby the first power storage apparatus are controlled. Thereby, it is possible to receive the power supply from the second power storage apparatus or to store the surplus power to the second power storage apparatus via the power distribution network.

The power storage control apparatus according to an embodiment of the disclosure further includes a display control part that displays the determination result from the status determination part on a display part. Here, information regarding the availability status of the first power storage apparatus determined by the status determination part is displayed on the display part. Thereby, the user of the first power storage apparatus can easily recognize that the first power storage apparatus is in the unavailable state due to maintenance or a failure, etc., for example.

A power storage control method according to an embodiment of the disclosure is a power storage control method for performing the charge/discharge control of a plurality of power storage apparatuses deployed in a power distribution network, and includes a status determination step, a signal generation step and a communication step. The status determination step determines the availability status of the first power storage apparatus deployed in the power distribution network. The signal generation step generates a control signal for using the second power storage apparatus connected to the first power storage apparatus in the power distribution network instead of the first power storage apparatus based on the determination result from the status determination step. The communication step transmits the control signal generated in the signal generation step to the second power storage apparatus.

Here, based on the determination result of the availability status of the first power storage apparatus included in the plurality of power storage apparatuses deployed in the power distribution network, the power storage control method performs the control for using another power storage apparatus (the second power storage apparatus) deployed nearby in the power distribution network instead of the first power storage apparatus. That is, in the power storage control method, if the first power storage apparatus is determined to be in the unavailable state, the control signal for using the second power storage apparatus deployed in the power distribution network nearby the first power storage apparatus instead of the first power storage apparatus is generated and transmitted to the second power storage apparatus.

Here, the second power storage apparatus used instead of the first power storage apparatus based on the availability status of the first power storage apparatus may be a single power storage apparatus or a plurality of power storage apparatuses. That is, a plurality of the second storage apparatuses may be used instead of the first power storage apparatus. Also, the availability status of the first power storage apparatus determined in the status determination step is a status indicating whether the first power storage is available as a power storage apparatus or not, and includes the unavailable state due to maintenance, the unavailable state due to a failure, the normal operational state, etc., for example.

Also, the determination of the abovementioned states of the first power storage apparatus uses the detection result of various sensors that detect current, voltage, etc. of cells included in the first power storage apparatus or information of the maintenance schedule, etc. Moreover, the usage of the second power storage apparatus includes, for example, a charge control that stores surplus power from each consumer or a discharge control that covers power consumption at each consumer, etc.

Whether the second power storage apparatus is deployed nearby in the power distribution network or not can be determined by using information such as the impedance value between the first power storage apparatus and the second power storage apparatus and the electricity network structure. Thereby, regarding a plurality of power storage apparatuses deployed nearby in the power distribution network, if a specific power storage apparatus (the first power storage apparatus) is unavailable, another power storage apparatus (the second power storage apparatus) can be used.

A power storage control program according to the disclosure is a power storage control program that performs the charge/discharge control of a plurality of power storage apparatuses deployed in a power distribution network, and makes a computer execute a power storage control method that includes a status determination step, a signal generation step and a communication step. The status determination step determines the availability status of the first power storage apparatus deployed in the power distribution network. The signal generation step generates a control signal for using the second power storage apparatus connected to the first storage apparatus in the power distribution network instead of the first storage apparatus based on the determination result from the status determination step. The communication step transmits the control signal generated in the signal generation step to the second power storage apparatus.

Here, based on the determination result of the availability status of the first power storage apparatus which is included in the plurality of power storage apparatuses deployed in the power distribution network, the power storage control program performs the control to use another power storage apparatus nearby (the second power storage apparatus) deployed in the power distribution network instead of the first power storage apparatus. That is, when the first power storage apparatus is determined to be in an unavailable state, the power storage control program generates a control signal for using the second power storage apparatus deployed in the power distribution network nearby the first power storage apparatus instead of the first power storage apparatus, and transmits the control signal to the second power storage apparatus.

Here, the second power storage apparatus which is used instead of the first power storage apparatus based on the availability status of the first power storage apparatus may be a single power storage apparatus or a plurality of power storage apparatuses. That is, a plurality of the second storage apparatuses may be used instead of the first power storage apparatus. Also, the availability status of the first power storage apparatus determined in the status determination step is a status indicating whether it is available as a power storage apparatus or not, and includes, for example, the unavailable state due to maintenance, the unavailable state due to a failure, the normal operational state, etc.

Also, the determination of the abovementioned states of the first power storage apparatus determines whether the first storage apparatus is available as a power storage apparatus, and uses the detection result of various sensors that measure current, voltage, etc. of cells included in the first power storage apparatus or information of the maintenance schedule, etc. Moreover, the usage of the second power storage apparatus includes, for example, a charge control that stores surplus power from each consumer or a discharge control that covers power consumption at each consumer, etc.

Whether the second power storage apparatus is deployed nearby in the power distribution network or not can be determined by using information such as the impedance value between the first power storage apparatus and the second power storage apparatus and the electricity network structure. Thereby, regarding a plurality of power storage apparatuses deployed nearby in the power distribution network, if a specific power storage apparatus (the first power storage apparatus) is unavailable, another power storage apparatus (the second power storage apparatus) can be used.

According the power storage control apparatus of the disclosure, under the configuration that a plurality of power storage apparatuses are deployed in a power distribution network, the second power storage apparatus connected to the first power storage apparatus in the power distribution network can be used based on the availability status of the first power storage apparatus.

DESCRIPTION OF THE EMBODIMENTS

A power storage control apparatus according to the first embodiment is described using FIGS. 1 to 4. Here, a consumer A 20 that is appeared in the following description owns a power generation apparatus (solar panel 21) and a power storage apparatus (first storage apparatus) 23 that is under maintenance, and the consumer A 20 desires to use power storage apparatuses (second storage apparatuses) 33 and 34 that are owned by other consumers in a power distribution network 51. A consumer B 30 means a consumer which owns a power generation apparatus (solar panel 31) and the power storage apparatus 33, and the power storage apparatus 33 shared in the power distribution network 51 is used by the consumer A 20. The consumer C 40 means a consumer which is connected to the power distribution network 51 nearby the consumer A 20 and the consumer B 30 and owns another power storage apparatus 43 searched by the consumer A 20.

The power storage apparatus 33 and 34 used by the consumer A 20 may be switched at a predetermined time interval. A consumer is, for example, an individual, an enterprise or a group, etc. that make a contract with an electric power company and uses electricity supplied through a system 50 (refer to FIG. 1) via the power distribution network 51 by the electric power company, and includes an ordinary home (single-family house, apartment house), an enterprise (office, factory, facility, etc.), a local government and a state institution, etc. Consumers include a consumer that generates electric power by private power generation or realizes a ZEB (Zero Power Building).

Also, in the following embodiment, the system 50 (refer to FIG. 1) means an electric power system that supplies electric power supplied by the electric power company to each consumer via the power distribution network 51. In the following embodiment, smart meters 27, 37 and 47 (refer to FIG. 1) mean measurement devices that are disposed in each consumer for measuring the generated power amount, the stored power amount and the consumed power amount and transmitting the measurement result to the electric power company, etc. by using a communication function. By disposing the smart meters 27, 37 and 47, the electric power company can accurately grasp the real-time electric power status at each of the consumers A 20, B 30 and C 40, and can automate the meter reading work performed in every predetermined period.

In the following embodiment, loads 24, 34 and 44 (refer to FIG. 1) mean power consumption units such as an air conditioner, a refrigerator, a microwave oven, an IH cooking heater and a television in case the consumer is an ordinary home, for example. If the consumer is an enterprise (factory, etc.), for example, the loads 24, 34 and 44 mean power consumption units such as various facilities disposed inside the factory and an air-conditioning facility. In the following embodiments, EMSs (Power Management Systems) 26, 36 and 46 (refer to FIG. 1) mean systems disposed in each of the consumers A 20, B 30 and C 40 to reduce the consumed power amount at the consumers A 20, B 30 and C 40.

First Embodiment

A power storage control apparatus 10 according to the first embodiment is disposed in the power storage apparatus 23 owned by the consumer A 20. The power storage control apparatus 10 searches other power storage apparatuses 33 and 43 owned by a plurality of consumers B 30 and C 40 connected to the power distribution network 51 based on the determination result of the availability status of the power storage apparatus 23, and uses an available power storage apparatus.

Figure 1:
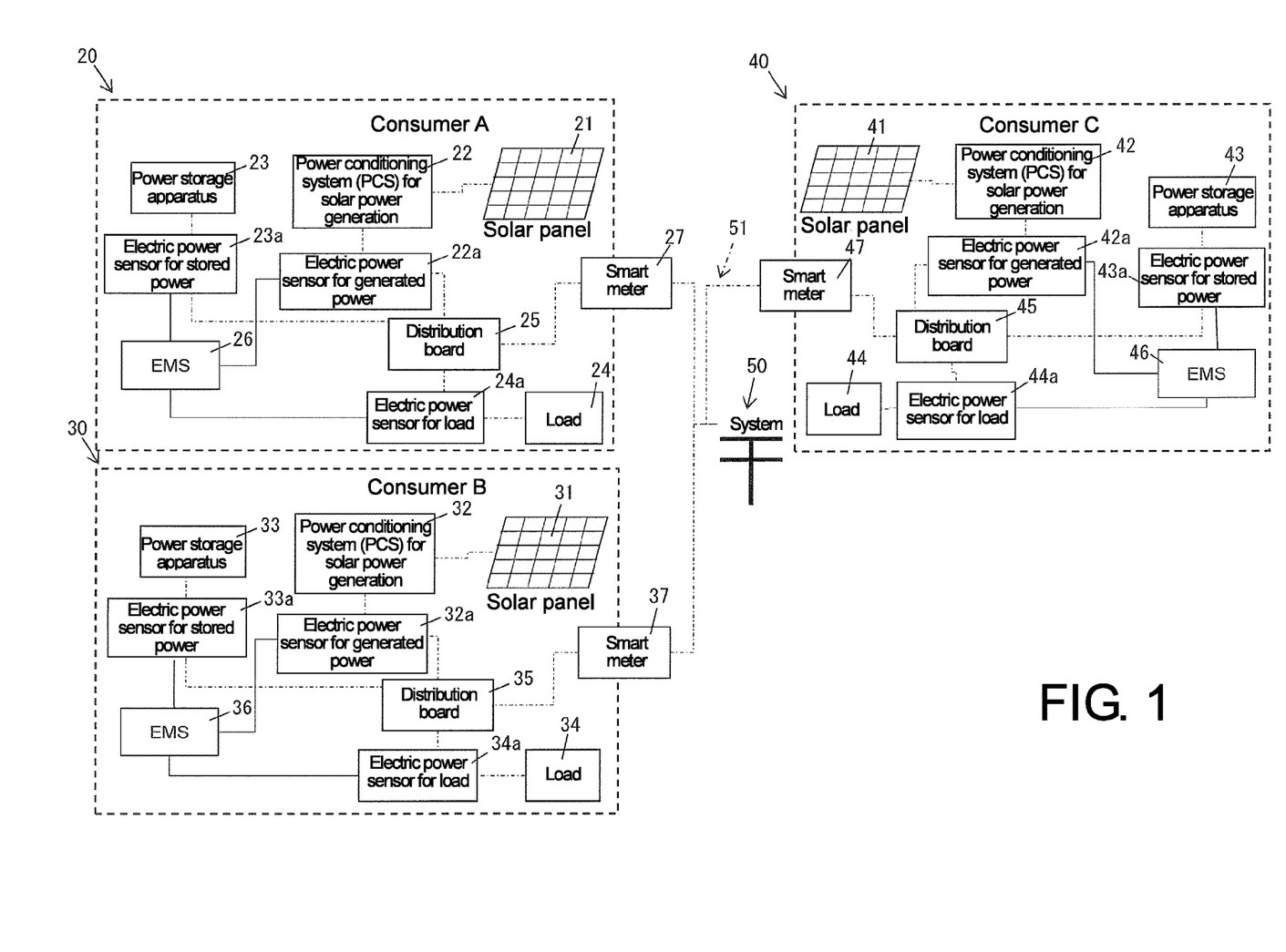
FIG. 1 is a block diagram illustrating the relationship between a power storage apparatus that is owned by the consumer A and includes a power storage control apparatus according to the first embodiment of the disclosure and power storage apparatuses that are owned by other consumers and deployed nearby in the power distribution network.
Figure 2:
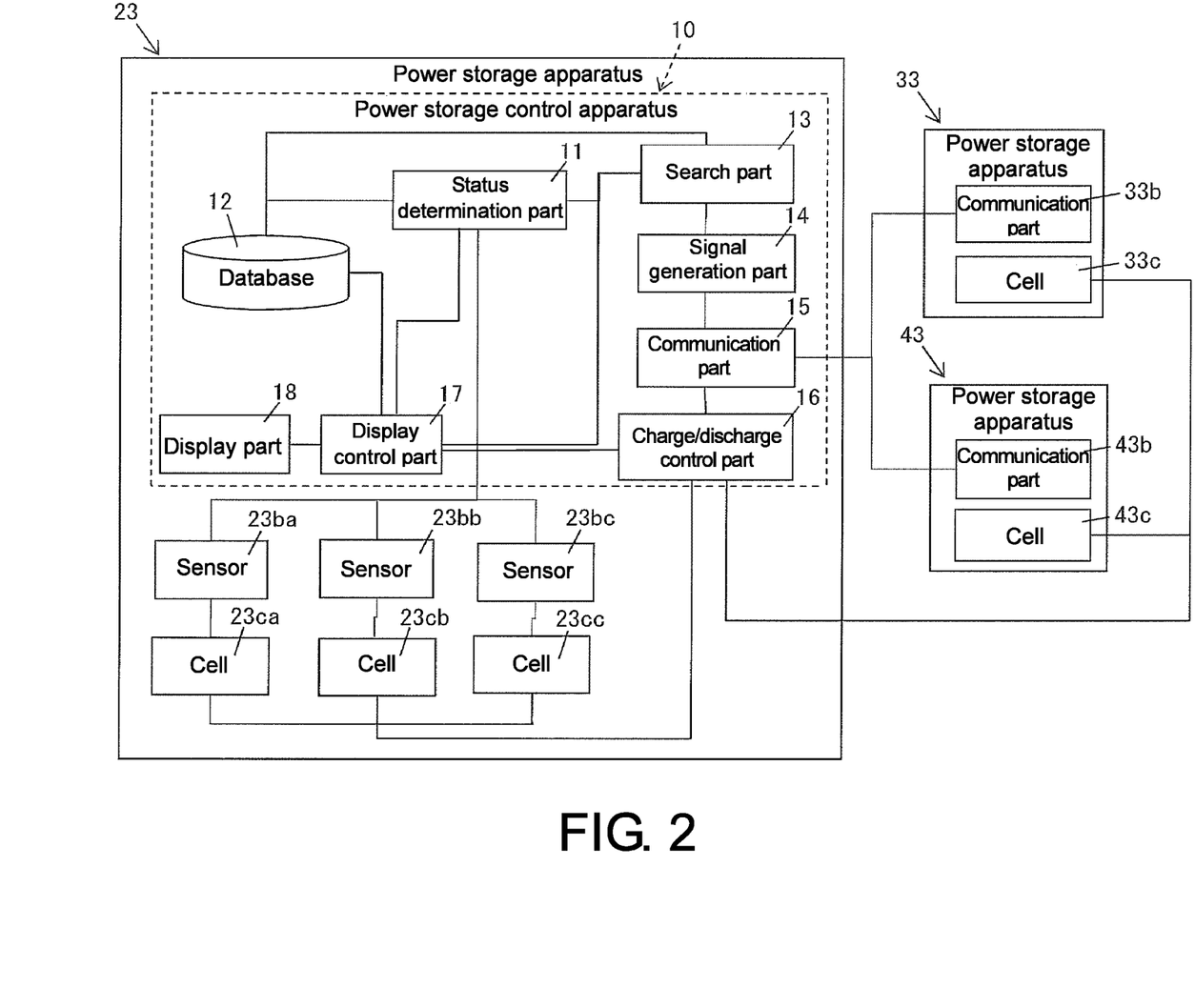
FIG. 2 is a block diagram illustrating the configuration of the power storage apparatus owned by the consumer A in FIG. 1.

Specifically, as shown in FIG. 2, when the power storage apparatus 23 owned by the consumer A 20 is determined to be under maintenance, the power storage control apparatus 10 searches other available power storage apparatuses 33 and 43 deployed in the power distribution network 51. Then, the power storage control apparatus 10 generates a control signal for using the most preferable power storage apparatus 33, and transmits the control signal to the power storage apparatus 33. The solid lines shown inside each of the consumers A 20, B 30 and C 40 in FIG. 1 indicate the flow of information such as a data, and dashed lines indicate the flow of electricity. The configuration of the power storage control apparatus 10 is described later.

[Consumer A]

In this embodiment, as shown in FIG. 1, the consumer A 20 is connected to the system 50 which supplies electric power supplied by the electric power company. The consumer A 20 is connected to the system 50 via the power distribution network 51 nearby the consumers B 30 and C 40 which are described later.

As shown in FIG. 1, the consumer A 20 has a solar panel (power generation apparatus) 21, a power conditioning system (PCS) for solar power generation 22, an electric power sensor for generated power 22a, a power storage apparatus (first storage apparatus) 23, an electric power sensor for stored power 23a, a load 24, an electric power sensor for load 24a, a distribution board 25, an EMS (Energy Management System) 26 and a smart meter 27. The solar panel 21 is an apparatus that generates electricity by utilizing a photovoltaic effect using the light energy of the solar light, and disposed on the roof, etc. of the consumer A 20. The generated power amount of the solar panel 21 can be predicted based on information regarding the sunshine duration of the weather forecast.

As shown in FIG. 1, the power conditioning system (PCS) for solar power generation 22 is connected to the solar panel 21, and converts the direct current generated by the solar panel 21 to the alternating current. As shown in FIG. 1, the electric power sensor for generated power 22a is connected to the power conditioning system for solar power generation 22, and measures the amount of power generated by the solar panel 21. Then, the electric power sensor for generated power 22a transmits the measurement result (generated power amount) to the EMS 26.

The power storage apparatus 23 is disposed for temporarily storing surplus power left unconsumed by the load 24 out of the power generated by the solar panel 21. Thereby, it is possible to eliminate wasting generated power by storing surplus power in the power storage apparatus 23 even the consumed power amount by the load 24 is low during the daytime in which the solar panel 21 generates electricity.

In this embodiment, the power storage apparatus 23 is a power storage apparatus that is shared by a plurality of consumers A 20, B 30 and C 40 nearby connected to the power distribution network 51, and described as a power storage apparatus that becomes unavailable due to maintenance. The power storage control apparatus 10 disposed in the power storage apparatus 23 is described in detail later. As shown in FIG. 1, the electric power sensor for stored power 23a is connected to the power storage apparatus 23 and measures the amount of power stored in the power storage apparatus 23. Then, the electric power sensor for stored power 23a transmits the measurement result (stored power amount) to the EMS 26.

As shown in FIG. 2, the power storage apparatus 23 has sensors 23ba, 23bb and 23bc and cells 23ca, 23cb and 23cc. The sensors 23ba, 23bb and 23bc measure the input/output current, the voltage value and temperature, etc. to determine the availability status of the power storage apparatus 23. The cells 23ca, 23cb and 23cc are components constituting the power storage apparatus 23 and store electric power, and the input/output current thereof is controlled by a charge/discharge control part 16.

As mentioned above, the load 24 is household electric appliances such as the air conditioner and the refrigerator in an ordinary home or the power consumption units such as various facilities and the air-conditioning facility in a factory, etc., and consumes the electric power supplied by the system 50, the electric power generated by the solar panel 21 and the electric power stored in the power storage apparatus 23. As shown in FIG. 1, the electric power sensor for load 24a is connected to the load 24 and measures the power amount consumed by the load 24. Then, the electric power sensor for load 24a transmits the measurement result (consumed power amount) to the EMS 26.

As shown in FIG. 1, the distribution board 25 is connected to the electric power sensor for generated power 22a, the electric power sensor for stored power 23a, the electric power sensor for load 24a and the smart meter 27. The distribution board 25 supplies the electric power generated by the solar panel 21 and the electric power stored in the power storage apparatus 23 to the load 24. As mentioned above, the EMS (Energy Management System) 26 is an energy management system disposed for reducing the consumed power amount at the consumer A 20, and connected to each of the sensors 22a, 23a and 24a, as shown in FIG. 1. The EMS 26 efficiently supplies electric power generated by the solar panel 21 and electric power stored in the power storage apparatus 23 to the load 24 by using detection results received from each of the sensors 22a, 23a and 24a. Thereby, it is possible to suppress the consumption amount of electric power supplied by the system 50 and effectively reduce the power cost at the consumer A 20.

As mentioned above, the smart meter 27 measures the generated power amount of the solar panel 21, the stored power amount of the power storage apparatus 23 and the consumed power amount of the load 24 respectively owned by the consumer A 20. As shown in FIG. 1, the smart meter 27 is connected to each of the sensors 22a, 23a and 24a via the distribution board 25. Moreover, the smart meter 27 has a communication function.

[Consumer B]

In this embodiment, as shown in FIG. 1, the consumer B 30 is connected to the system 50 via the power distribution network 51, as the same as the consumer A 20. In this embodiment, the consumer B 30 owns the power storage apparatus (second power storage apparatus) 33. The power storage apparatus 33 is selected as a power storage apparatus used by the consumer A 20 instead of the power storage apparatus 23. As shown in FIG. 1, the consumer B 30 has a solar panel (power generation apparatus) 31, a power conditioning system (PCS) for solar power generation 32, an electric power sensor for generated power 32a, the power storage apparatus (first storage apparatus) 33, an electric power sensor for stored power 33a, a load 34, an electric power sensor for load 34a, a distribution board 35, an EMS (Energy Management System) 36 and a smart meter 37, as the same as the consumer A 20.

The solar panel 31 is an apparatus that generates electricity by utilizing a photovoltaic effect using the light energy of the solar light, and disposed on the roof, etc. of the consumer B 30. The generated power amount of the solar panel 31 can be predicted based on information regarding the sunshine duration of the weather forecast. As shown in FIG. 1, the power conditioning system (PCS) for solar power generation 32 is connected to the solar panel 31, and converts the direct current generated at the solar panel 21 to the alternating current.

As shown in FIG. 1, the electric power sensor for generated power 32a is connected to the power conditioning system for solar power generation 32, and measures the generated power amount of the solar panel 31. Then, the electric power sensor for generated power 32a transmits the measurement result (generated power amount) to the EMS 36. The power storage apparatus 33 is disposed for temporarily storing surplus power left unconsumed by the load 34 out of the electric power generated at the solar panel 21. Thereby, it is possible to eliminate wasting generated power by storing surplus power in the power storage apparatus 33 even the consumed power amount by the load 34 is low during the daytime in which the solar panel 31 generates electricity.

As shown in FIG. 1, the electric power sensor for stored power 33a is connected to the power storage apparatus 33, and measures the electric power amount stored in the power storage apparatus 33. Then, the electric power sensor for stored power 33a transmits the measurement result (stored power amount) to the EMS 36. As mentioned above, the load 34 is household electric appliances such as the air conditioner and the refrigerator in an ordinary home or the power consumption units such as various facilities and the air-conditioning facility in a factory, etc., and consumes electric power supplied by the system 50, electric power generated by the solar panel 31 and electric power stored in the power storage apparatus 33.

As shown in FIG. 1, the electric power sensor for load 34a is connected to the load 34, and measures the electric power amount consumed by the load 34. Then, the electric power sensor for load 34a transmits the measurement result (consumed power amount) to the EMS 36. As shown in FIG. 1, the distribution board 35 is connected to the electric power sensor for generated power 32a, the electric power sensor for stored power 33a, the electric power sensor for load 34a and the smart meter 37. The distribution board 35 supplies electric power generated by the solar panel 31 and electric power stored in the power storage apparatus 33 to the load 34.

As mentioned above, the EMS (Energy Management System) 36 is an energy management system disposed for reducing the consumed power amount at the consumer B 30, and connected to each of the sensors 32a, 33a and 34a, as shown in FIG. 1. The EMS 36 efficiently supplies the electric power generated by the solar panel 31 and the electric power stored in the power storage apparatus 33 to the load 34 by using detection results received from each of the sensors 32a, 33a and 34a. Thereby, it is possible to suppress the consumption amount of electric power supplied by the system 50 and effectively reduce the power cost at the consumer B 30.

As mentioned above, the smart meter 37 measures the generated power amount of the solar panel 31, the stored power amount of the power storage apparatus 33 and the consumed power amount of the load 34 respectively owned by the consumer B 30. As shown in FIG. 1, the smart meter 37 is connected to each of the sensors 32a, 33a and 34a via the distribution board 35. Moreover, the smart meter 37 has a communication function.

[Consumer C]

In this embodiment, as shown in FIG. 1, the consumer C 40 is connected to the system 50 through the power distribution network 51 nearby the consumers A 20 and B 30. In this embodiment, the consumer C 40 owns the power storage apparatus (second power storage apparatus) 43 which is shared via the power distribution network 51. The power storage apparatus 43 is an unselected power storage apparatus searched as a candidate which can be used by the consumer A 20 instead of the power storage apparatus 23. As shown in FIG. 1, the consumer C 40 has a solar panel (power generation apparatus) 41, a power conditioning system (PCS) for solar power generation 42, an electric power sensor for generated power 42a, the power storage apparatus (second power storage apparatus) 43, an electric power sensor for stored power 43a, a load 44, an electric power sensor for load 44a, a distribution board 45, an EMS (Energy Management System) 46 and a smart meter 47. The detailed description of these components is omitted since these components have the same functions as the components owned by the consumers A 20 and B 30.

[Configuration of Power Storage Control Apparatus 10]

As shown in FIG. 2, the power storage control apparatus 10 according to this embodiment is disposed in the power storage apparatus 23 which can be shared among the consumers A 20, B 30 and C 40 in the power distribution network 51. If the power storage control apparatus 10 determines that the power storage apparatus 23 is unavailable due to maintenance or a failure as the result of the availability status determination performed when the consumer A 20 is about to use the power storage apparatus 23, the power storage control apparatus 10 searches other power storage apparatuses 33, 34, etc. and uses an available power storage apparatus.

As shown in FIG. 2, the power storage control apparatus 10 includes a status determination part 11, a database 12, a search part 13, a signal generation part 14, a communication part 15, the charge/discharge control part 16, a display control part 17 and a display part 18. The status determination part 11 is connected to the sensors 23ba, 23bb and 23bc which respectively monitor the input/output current of the plurality of cells 23ca, 23cb and 23cc constituting the power storage apparatus 23. The status determination part 11 determines the availability status of the power storage apparatus 23 based on the detection result from the sensors 23ba, 23bb and 23bc, the maintenance schedule of the power storage apparatus 23, the current time, etc.

Here, the availability status of the power storage apparatus 23 determined by the status determination part 11 includes "in normal operation", "under maintenance", "in a failure condition", etc. In this embodiment, the case where the status determination part 11 determines that the power storage apparatus 23 is "under maintenance" and unavailable for the charge/discharge function is described as an example below. For example, if the status determination part 11 refers to information of the maintenance schedule stored in the database 12 and finds out that the current time falls within the maintenance period, the status determination part 11 determines that the power storage apparatus 23 is "under maintenance" and the charge/discharge function of the power storage apparatus 23 is unavailable.

Whether the power storage apparatus 23 is in a failure condition or not may be determined based on the detection result of the sensors 23ba, 23bb and 23bc connected to the status determination part 11. That is, the power storage apparatus 23 may be determined to be in a failure condition if the current value or the voltage value cannot be detected by sensors 23ba, 23bb and 23bc. The database 12 is connected to the status determination part 11, the search part 13 and the display control part 17. The database 12 stores information related to the maintenance schedule of the power storage apparatus 23 used for the determination by the status determination part 11, the determination result from the status determination part 11, and the search result from the search part 13, etc.

The search part 13 searches shared power storage apparatuses 33, 43, etc. owned by other consumers B 30, C 40, etc. deployed in the power distribution network when the power storage apparatus 23 is determined to be under maintenance and unavailable by the status determination part 11. That is, in this embodiment, the charge/discharge function of the power storage apparatus 23 owned by the consumer A 20 is determined to be in the unavailable state. Therefore, the search part 13 searches and selects the power storage apparatuses 33 and 43 nearby in the power distribution network 51, the charged capacity of which is ample, to secure a power storage apparatus the customer A 20 desires to use.

Here, the following search criteria may be used by the search part 13: a power storage apparatus that is deployed in the power distribution network 51 to which the consumer A 20 is connected; a power storage apparatus that has a margin equivalent to the capacity the consumer A 20 desires to use; a power storage apparatus that is located in a close distance to the consumer A 20 in the power distribution network 51; a power storage apparatus the use of which is permitted by other consumers B 30 and C 40 which owns the power storage apparatus; etc.

Regarding whether a power storage apparatus is deployed in the power distribution network 51 which the consumer A 20 is connected to or not, the search targets may be narrowed down based on information regarding the power distribution network 51 stored in the database 12 in advance, or the search targets may be pre-configured as a searchable range in the search part 13. The margin of the charge capacity of other power storage apparatuses may be determined by, for example, referring to information regarding charge capacity that is unused for a month.

Further, whether a power storage apparatus is located in a close distance to the consumer A 20 in the power distribution network 51 or not is, for example, determined by referring to the impedance value between the two power storage apparatuses. That is, the longer the distance between two power storage apparatuses is, the higher the impedance value becomes. Accordingly, it is not possible to efficiently use a power storage apparatus with high impedance because the loss of electric power supplied to the consumer A 20 is great, for example.

Whether the consumer B 30 or C 40 has been issued a permission to use or not is determined by using, for example, information related to the existence of the consent for using the power storage apparatus confirmed in advance from each of the consumers A 20, B 30 and C 40 connected to the power distribution network 51. The information regarding the consent may be stored in the database 12 and used when performing the search. The search part 13 stores the search result after converting it to a table (refer to FIG. 4).

Based on the determination result from the status determination part 11, the signal generation part 14 generates a control signal for using the charge/discharge function of the power storage apparatus 33 which is selected as a power storage apparatus matching the search criteria by the search part 13 out of power storage apparatuses 33, 43, etc. deployed in the power distribution network 51. The signal generation part 14 generates a reservation signal for reserving the power storage apparatus 33 matching the search criteria (conditions required by the consumer A 20) as a result of the search by the search part 13.

The communication part 15 transmits the control signal generated by the signal generation part 14 to the communication part 33b of the power storage apparatus 33 or the communication part 43b of the power storage apparatus 43. Thereby, the power storage apparatus 33 or the power storage apparatus 43 received the control signal is able to let the consumer A 20 use the charge/discharge function of cells 33c or cells 43c. The charge/discharge control part 16 is connected to the cells 23ca, 23cb and 23cc constituting the power storage apparatus 23 as well as the cell 33c constituting the power storage apparatus 33 and the cell 43c constituting the power storage apparatus 43 deployed in the power distribution network 51. The charge/discharge control part 16 is capable of performing the charge/discharge control of the power storage apparatus 23 and the charge/discharge control of the power storage apparatuses 33 and 43 deployed in the power distribution network 51 as well based on the control signal transmitted from the communication part 15.

The display control part 17 is connected to the status determination part 11, the database 12, the search part 13, the charge/discharge control part 16 and the display part 18. The display control part 17 displays the determination result from the status determination part 11, various information stored in the database 12, the search result from the search part 13, the control contents of the charge/discharge control part 16, etc. Thereby, the consumer A 20 which is the owner of the power storage apparatus 23 can easily grasp information regarding the availability status of the power storage apparatus 23 and the availability of other power storage apparatuses 33, 34, etc. The display part 18 is, for example, a display device using a liquid crystal display panel, and the display thereof is controlled by the display control part 17.

[Power Storage Control Method]

Figure 3:
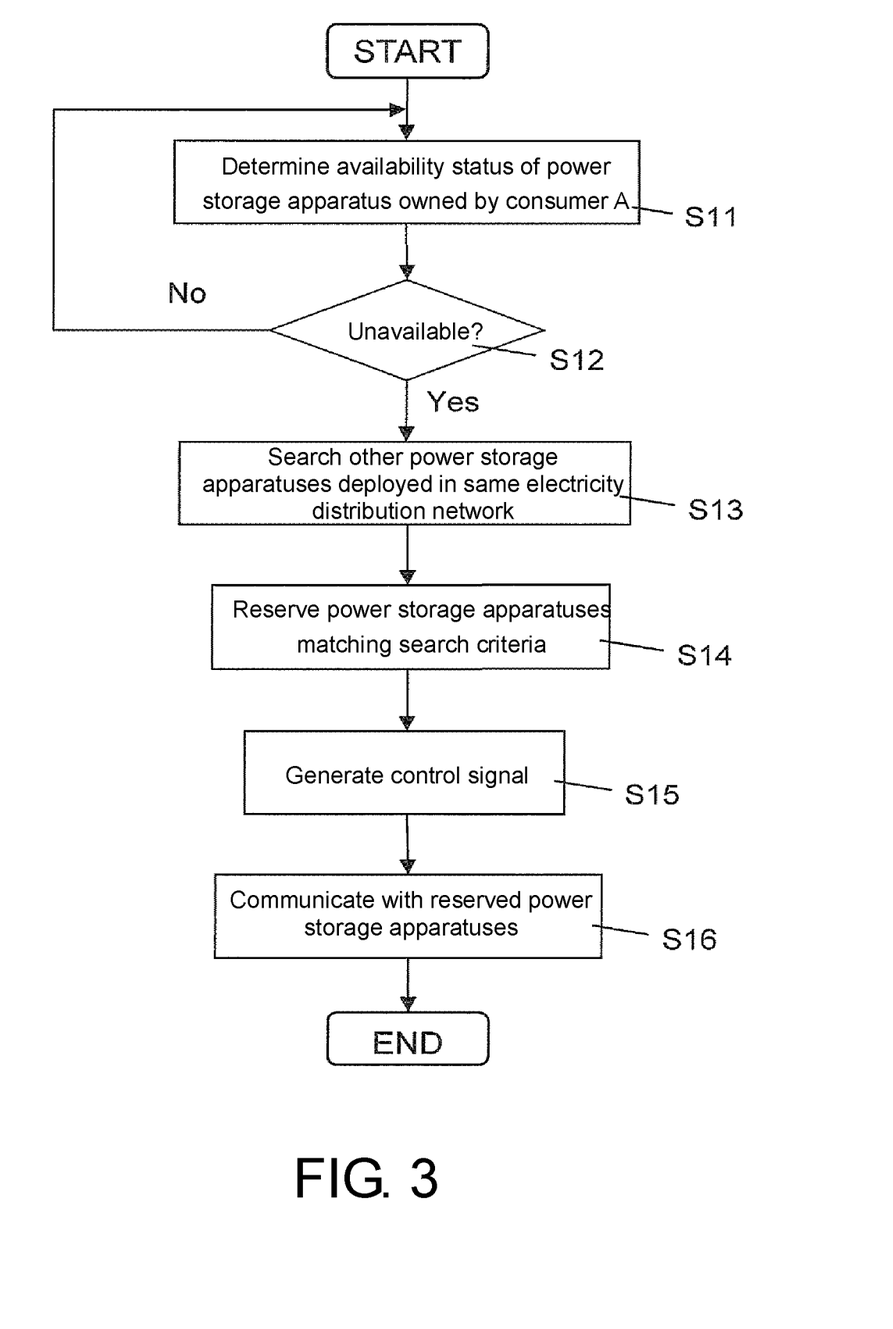
FIG. 3 is a flowchart illustrating the flow of the power storage control method by the power storage control apparatus of FIG. 2.

In the power storage control apparatus 10 according to this embodiment, the status determination part 11 determines the availability status of the power storage apparatus 23 owned by the consumer A 20 by the abovementioned configuration according to the flowchart shown in FIG. 3. Then, the power storage control apparatus 10 generates the control signal for using the power storage apparatus 33 deployed in the power distribution network 51 by using the signal generation part 14 based on the determination result from the status determination part 11, and transmits the control signal to the power storage apparatus 33 through the communication part 15.

That is, firstly, the availability status of the power storage apparatus 23 owned by the consumer A 20 is determined in Step S11. Here, the availability status of the power storage apparatus 23 includes "under maintenance", "in a failure condition" and "in normal operation", etc., as mentioned above. The determination of whether the power storage apparatus 23 is under maintenance or not is performed by referring to information related to the maintenance schedule stored in the database 12 and information of the current date and time.

Next, whether the power storage apparatus 23 is unavailable or not is determined in Step S12. Here, the process proceeds to Step S13 if the power storage apparatus 23 is determined to be unavailable. On the contrary, the process returns to Step S11 if the power storage apparatus 23 is determined to be available. Next, in Step S13, because the power storage apparatus 23 is determined to be unavailable in Step S12, power storage apparatuses that match the conditions required by the consumer A 20 are searched from other power storage apparatuses 33, 43, etc. deployed in the power distribution network 51.

Next, in Step S14, the power storage apparatus 33 which matches the search criteria (conditions required by the consumer A 20) as the result of the search in Step S13 is selected, and the signal generation part 14 generates the reservation signal and reserves the use (capacity, time, etc.) of the power storage apparatus 33. Here, FIG. 4 illustrates the search result of a plurality of charging apparatuses that is searched with the criteria of an unused battery capacity of greater than or equal to 100 wh and an impedance value of less than or equal to 2.0 mΩ among a plurality of power storage apparatuses deployed in the power distribution network 51.

That is, an unused battery capacity of 100 wh or more means the electric power amount required by the consumer A 20. The impedance value of 2.0 mΩ or less means a condition that the transmission loss which occurred when electric power is supplied from the selected power storage apparatus to the consumer A 20 is minor, for example. An ID is assigned to each of the plurality of charging apparatuses listed in the search result, and, for example, ID10000 indicates the power storage apparatus 23 which is owned by the consumer A 20 and currently unavailable.

Figure 4:
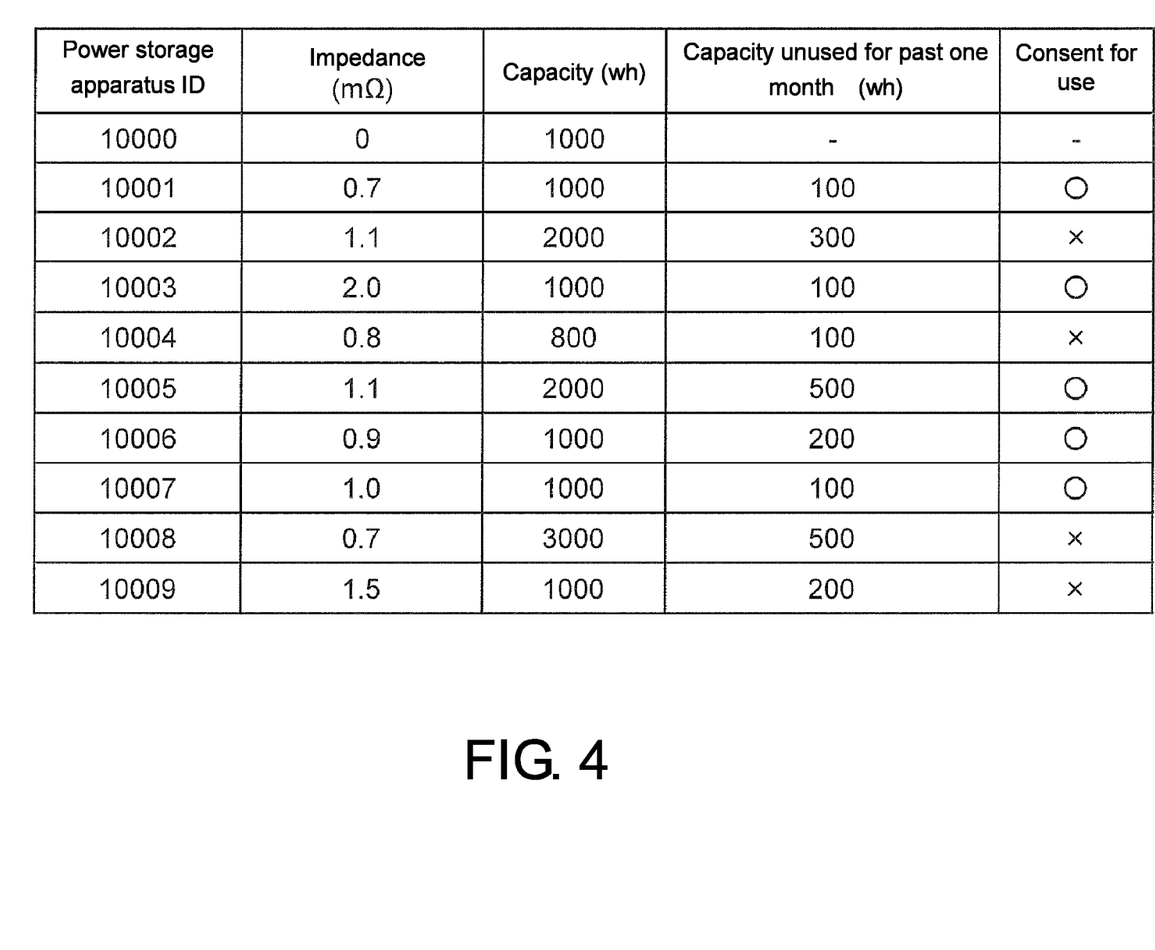
FIG. 4 is a diagram illustrating other power storage apparatuses nearby in the power distribution network searched by the search part included in the power storage control apparatus of FIG. 2.

Also, in FIG. 4, information regarding the impedance, the battery capacity, the unused capacity, the existence of the consent of each of the charging apparatuses is indicated. Regarding the destination of the control signal, the ID of a power storage apparatus with low impedance is selected in a preferential manner among power storage apparatuses in which reserved capacity exists, and the control signal is transmitted to the selected power storage apparatus. For example, in the search result shown in FIG. 4, a power storage apparatus of ID10001 which is permitted to use is selected from the power storage apparatuses of ID10001 and ID10008, both of which have the lowest impedance value of 0.7 mΩ.

Next, in Step S15, the signal generation part 14 generates the control signal which is later transmitted to the power storage apparatus 33 which is reserved to use in Step S14. Next, in Step S16, the communication part 15 transmits the control signal generated in Step S14 to the power storage apparatus 33. As mentioned above, when the availability status of the power storage apparatus 23 owned by the consumer A 20 is detected and determined to be unavailable, the power storage control apparatus 10 according to this embodiment searches other power storage apparatuses 33, 43, etc. deployed in the power distribution network 51 and reserves the power storage apparatus 33 which matches the condition. Then, by transmitting the control signal to the power storage apparatus 33, the consumer A 20 can use the power storage apparatus 33 connected via the power distribution network 51.

As a result, the consumer A 20 can use power storage apparatuses 33, etc. owned by other consumers B 30, etc. connected via the power distribution network 51 even the power storage apparatus 23 owned by itself is unavailable. As shown in FIG. 4, if there are a plurality of power storage apparatuses (ID10001, 10003 and 10005 to 10007) which is permitted to use, among the power storage apparatuses (ID10001 to 10009) searched by the search part 13, the control signal for using a portion of capacity the consumer A 20 requires (10%, for example) for a period of time (5 days, for example) may be sent to each of the plurality of power storage apparatuses.

In this case, it is possible to use 10% of the charge capacity of each of the plurality of power storage apparatuses receiving the control signal, for 5 days. Also, in the actual use, if the consumer A 20 desires to charge the photovoltaic generated power amount during the daytime and to use the electric power at night, the control signal is transmitted to the power storage apparatuses 33, etc. deployed nearby in the power distribution network 51.

Specifically, for example, if the power storage apparatus 33 of ID10001 receives a charge control signal, it is possible to charge the power storage apparatus 33 with the current value requested by the consumer A 20, which is the owner of the power storage apparatus 23 of ID10000, in addition to the current value used by the consumer B 30, which is the owner of the power storage apparatus 33 of ID10001. The contents of the control signal and the destination of the control signal may be determined based on the impedance value shown in FIG. 4, as mentioned above.

Also, the power storage apparatuses 23 and 33 are deployed at physically separated locations. Therefore, the control signal may inform the charge/discharge current and the capacity after a certain period of time, and the actual control may be performed by the power storage apparatus 23. Regarding the destination of the control signal, the ID of a power storage apparatus with low impedance is selected in a preferential manner among power storage apparatuses in which reserved capacity exists, and the control signal is transmitted to the selected power storage apparatus. In the case shown in FIG. 4, the power storage apparatus of ID10001 which is permitted to use is selected from the power storage apparatus of ID10001 and the power storage apparatus of ID10008, both of which have the lowest impedance value of 0.7 mΩ.

Other Embodiments

An embodiment of the disclosure is described above, but the present invention is not limited thereto, and various modifications may be made within the scope which is not deviating the gist of the present invention.

[A] In the aforementioned embodiment, the power storage control method according to the disclosure is described using an example which is performed according to the flowchart shown in FIG. 3, but the present invention is not limited thereto. For example, the present invention may be realized as a power storage control program that makes a computer operate the power storage control method according to the flowchart shown in FIG. 3. Also, the present invention may be realized as a storage medium storing the power storage control program.

[B] The aforementioned embodiment describes an example that the power storage control apparatus 10 is disposed in the power storage apparatus 23 owned by the consumer A 20, but the present invention is not limited thereto.

Figure 5:
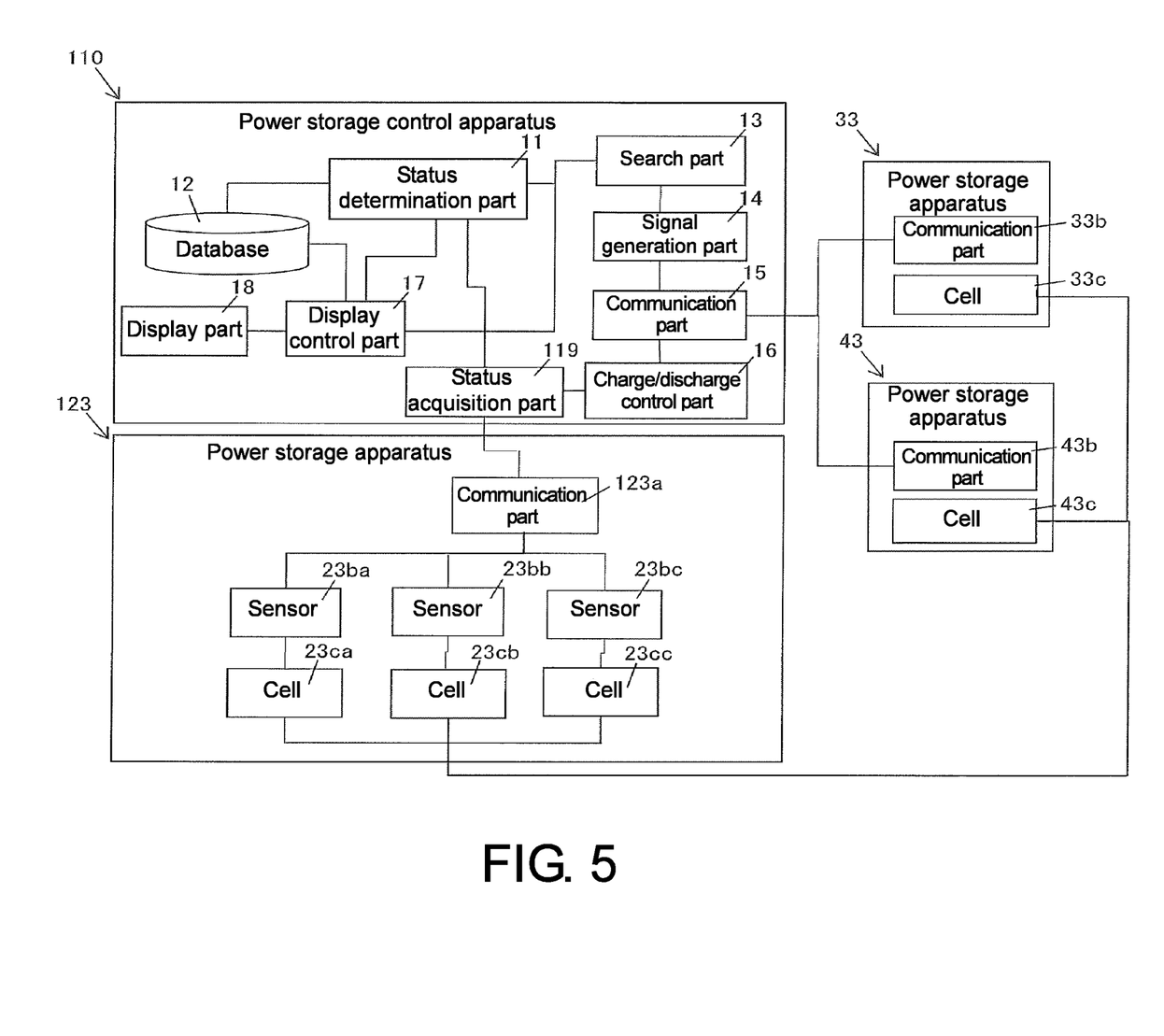
FIG. 5 is a block diagram illustrating the configuration of a power storage control apparatus according to another embodiment of the disclosure.

For example, as shown in FIG. 5, the power storage control apparatus according to the present invention may be configured as a power storage control apparatus 110 that is disposed separately from a power storage apparatus 123. In this case, the information used for the determination by the status determination part 11 may be acquired by disposing a status acquisition part 119 that acquires the availability status of the power storage apparatus 123 via a communication part 123a at the power storage apparatus 123 side.

[C] The aforementioned embodiment describes an example that the consumer A 20 uses a single power storage apparatus 33 owned by the consumer B 30 instead of its own unavailable power storage apparatus 23, but the present invention is not limited thereto. For example, the consumer A 20 may generate the control signal for using a plurality of power storage apparatuses such as the power storage apparatus 33 owned by the consumer B 30, the power storage apparatus 43 owned by the consumer C 40, etc. instead of its own power storage apparatus 23 which is in the unavailable state, and transmits the control signal to each of the power storage apparatuses.

Figure 6:
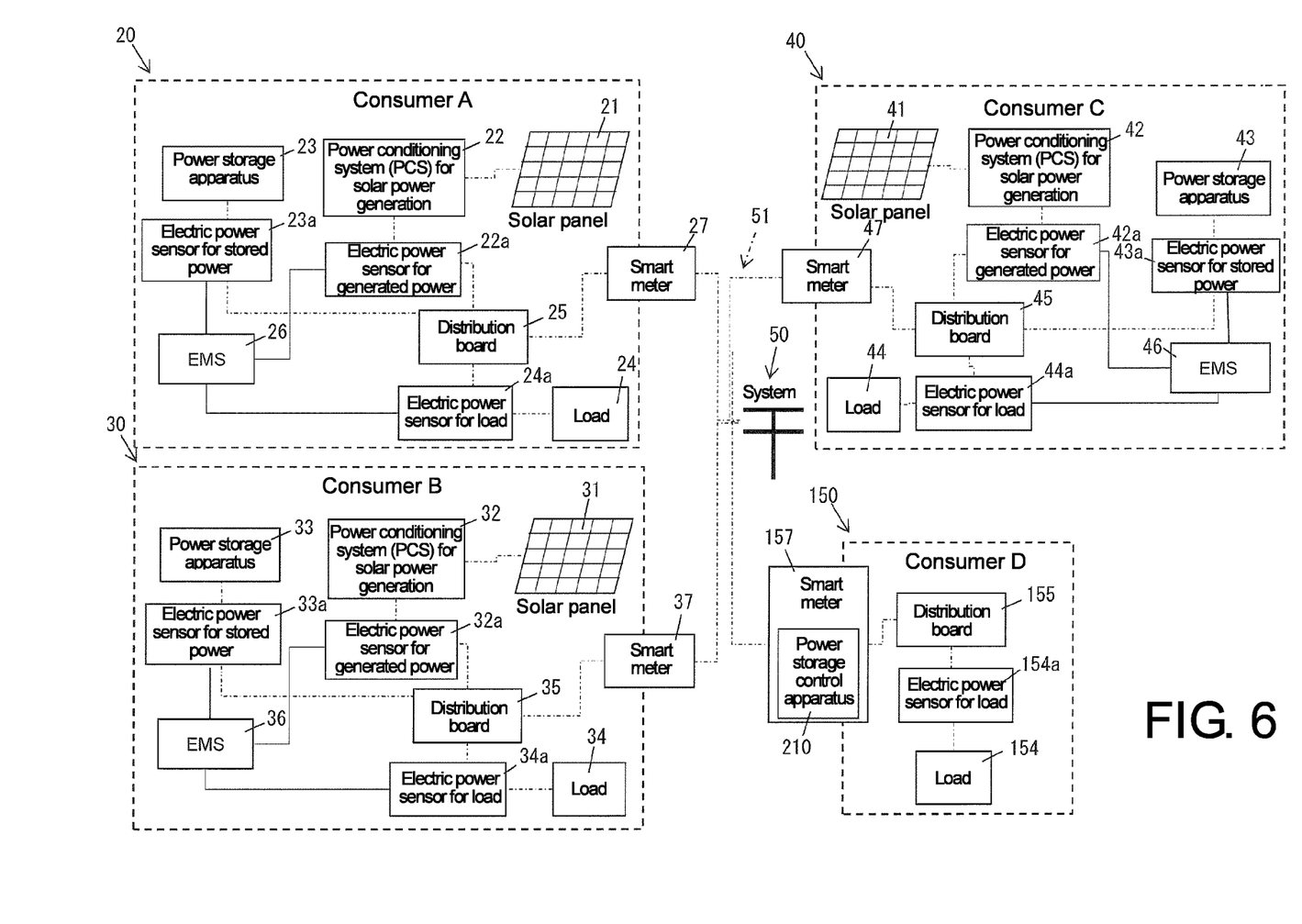
FIG. 6 is a block diagram illustrating the relationship between the consumer D that owns a power storage control apparatus according to yet another embodiment of the disclosure and power storage apparatuses that are owned by other consumers and deployed nearby in the power distribution network.

[D] The aforementioned embodiment describes an example that the consumer A 20 uses the power storage apparatus 33 owned by the consumer B 30 connected via the power distribution network 51 when its own power storage apparatus 23 is unavailable, but the present invention is not limited thereto. For example, as shown in FIG. 6, the present invention may be applied to a case where a consumer D 150 that does not own a power storage apparatus uses the power storage apparatuses 33 and 43 owned by the consumers B 30 and C 40 when the consumer D 150 tries to use the power storage apparatus 23 owned by the consumer A 20 but the power storage apparatus 23 is determined to be unavailable.

In this case, for example, the consumer D 150 may dispose a power storage control apparatus 210 in a smart meter 157 that is connected to a load 154 through a distribution board 155 and an electric power sensor for load 154a.

[E] The aforementioned embodiment describes an example that each of the consumers A 20, B 30 and C 40 includes power supply apparatuses such as the solar panel 21, 31 and 41 and the power storage apparatus 23, 33 and 43, but the present invention is not limited thereto. For example, a power supply apparatus owned by each of the consumers may be a wind power generation apparatus or a power generation apparatus utilizing natural energy such as a geothermal power generation apparatus, and also (a battery mounted on) an electric vehicle or a heat pump may be used. Also, a power supply apparatus owned by each of the consumers may not be of the same type, and a different type of power supply apparatus may be owned by each of the consumers.

[F] The aforementioned embodiment describes an example that the power storage control apparatus 10 includes the display control part 17 and the display part 18, but the present invention is not limited thereto. For example, a display screen of an external device such as a display of a PC (Personal Computer) may be used as the display part.

In this case, the screen of the PC display, etc. may be controlled by the display control part 17 included in the power storage control apparatus 10 or by transmitting display information to the display control part at the PC side.

The power storage control apparatus according to the disclosure has an effect that under the configuration which a plurality of power storage apparatuses are deployed in a power distribution network, it is possible to use the second power storage apparatus connected to the first power storage apparatus in the power distribution network based on the availability status of the first power storage apparatus. Therefore, the power storage control apparatus can be widely applied to systems in which a plurality of power storage apparatuses is deployed in a power distribution network.

What is claimed is:

1. A power storage control apparatus for performing a charge/discharge control of a plurality of power storage apparatuses deployed in a power distribution network, comprising:
a status determination part, determining an availability status of a first power storage apparatus deployed in the power distribution network,
a signal generation part, generating a control signal for using a second power storage apparatus connected to the first power storage apparatus in the power distribution network instead of the first power storage apparatus based on a determination result from the status determination part,
a communication part, transmitting the control signal generated by the signal generation part to the second power storage apparatus,
a storage part, storing information of maintenance schedule of the first power storage apparatus, wherein
the status determination part determines whether the first power storage apparatus is in a maintenance state or not based on the information of maintenance schedule stored in advance in the storage part, and
a search part, searching the second power storage apparatus deployed in the power distribution network based on search criteria comprising an impedance value between the first power storage apparatus and the second power storage apparatus.

2. The power storage control apparatus according to claim 1, wherein the status determination part determines whether the first power storage apparatus is in an unavailable state of or not.

3. The power storage control apparatus according to claim 2, wherein the status determination part determines whether the first power storage apparatus is in the unavailable state or not based on a detection result from at least any one of an accelerator sensor, a temperature sensor, a current sensor and a voltage sensor that are disposed in the first power storage apparatus.

4. The power storage control apparatus according to claim 2, wherein the status determination part determines whether the first power storage apparatus is in a failure state or not based on a detection result from a voltage sensor disposed in the first power storage apparatus.

5. The power storage control apparatus according to claim 1, wherein the status determination part determines whether the first power storage apparatus is in a normal operational state or not.

6. The power storage control apparatus according to claim 1, wherein the signal generation part generates the control signal for controlling charge/discharge of a plurality of the second power storage apparatuses.

7. The power storage control apparatus according to claim 1, wherein the signal generation part generates a reservation signal for reserving at least a portion of a charge capacity of the second power storage apparatus.

8. The power storage control apparatus according to claim 1, wherein the signal generation part controls an input/output current of the second power storage apparatus according to the control signal.

9. The power storage control apparatus according to claim 1, further comprising a display control part that makes a display part display the determination result from the status determination part.

10. A power storage control method for performing a charge/discharge control of a plurality of power storage apparatuses deployed in a power distribution network, the power storage control method comprising:
a status determination step, determining an availability status of a first power storage apparatus that is deployed in the power distribution network;
a signal generation step, generating a control signal for using a second power storage apparatus that is connected to the first power storage apparatus in the power distribution network instead of the first power storage apparatus based on a determination result from the status determination step;

a communication step, transmitting the control signal generated in the signal generation step to the second power storage apparatus, wherein the schedule determining step determines whether the first power storage apparatus is in a maintenance state or not based on information of maintenance schedule stored in advance; and a searching step, searching the second power storage apparatus deployed in the power distribution network based on search criteria comprising an impedance value between the first power storage apparatus and the second power storage apparatus.

11. A power storage control program for performing a charge/discharge control of a plurality of power storage apparatuses deployed in a power distribution network on a computer, the power storage control program comprising a status determination step, determining an availability status of a first power storage apparatus deployed in the power distribution network;

a signal generation step, generating a control signal for using a second power storage apparatus connected to the first power storage apparatus in the power distribution network instead of the first power storage apparatus based on a determination result in the status determination step;

a communication step, transmitting the control signal generated in the signal generation step to the second power storage apparatus, wherein the schedule determining step determines whether the first power storage apparatus is in a maintenance state or not based on information of maintenance schedule stored in advance; and a searching step, searching the second power storage apparatus deployed in the power distribution network based on search criteria comprising an impedance value between the first power storage apparatus and the second power storage apparatus.

* * * * *